United States Patent [19]

Yamada

[11] Patent Number: 5,243,217
[45] Date of Patent: Sep. 7, 1993

[54] SEALED SEMICONDUCTOR DEVICE WITH PROTRUDING PORTION

[75] Inventor: Toshifusa Yamada, Kanagawa, Japan

[73] Assignee: Fuji Electric Co., Ltd., Kanagawa, Japan

[21] Appl. No.: 773,219

[22] Filed: Oct. 9, 1991

[30] Foreign Application Priority Data

Nov. 3, 1990 [JP] Japan .................. 2-298371

[51] Int. Cl.$^5$ ............................. H01L 23/28
[52] U.S. Cl. .................. 257/692; 257/729; 257/787; 361/773
[58] Field of Search ............ 357/72, 74, 65, 68; 257/787, 790, 692, 723, 729, 669; 361/417, 421, 404, 405, 406

[56] References Cited

U.S. PATENT DOCUMENTS

| | | | |
|---|---|---|---|
| 4,532,539 | 6/1985 | Frister | 357/72 |
| 4,558,510 | 12/1985 | Tani et al. | 357/72 |
| 4,825,279 | 4/1989 | Furuhata | 357/72 |
| 4,987,474 | 1/1991 | Yasuhara et al. | 357/72 |

FOREIGN PATENT DOCUMENTS 0025612 3/1981 European Pat. Off. .
0196747 10/1986 European Pat. Off. .

Primary Examiner—William Mintel
Assistant Examiner—Roy Potter
Attorney, Agent, or Firm—Finnegan, Henderson, Farabow, Garrett & Dunner

[57] ABSTRACT

A sealed semiconductor device, comprising at least one semiconductor chip, a wiring circuit board having the at least one semiconductor chip disposed thereon, at least one inner wire connecting the semiconductor chip to the wiring circuit board, a base board having the wiring circuit board disposed thereon, the base board enclosed on all sides forming a case, a silicon gel layer partially filling the case, a sealing resin layer disposed within the case above the silicon gel layer, a resin block in contact with the sealing resin layer, at least one inner terminal portion electrically connected to the wiring circuit board, at least one intermediate protruding portion electrically connected to, and projecting upwardly from, the at least one inner terminal portion, at least one aperture through the at least one intermediate protruding portion, the at least one aperture substantially disposed along a direction of a current passing through the at least one intermediate protruding portion within the case, and an outer terminal portion electrically connected to the at least one intermediate protruding portion is disclosed.

26 Claims, 2 Drawing Sheets

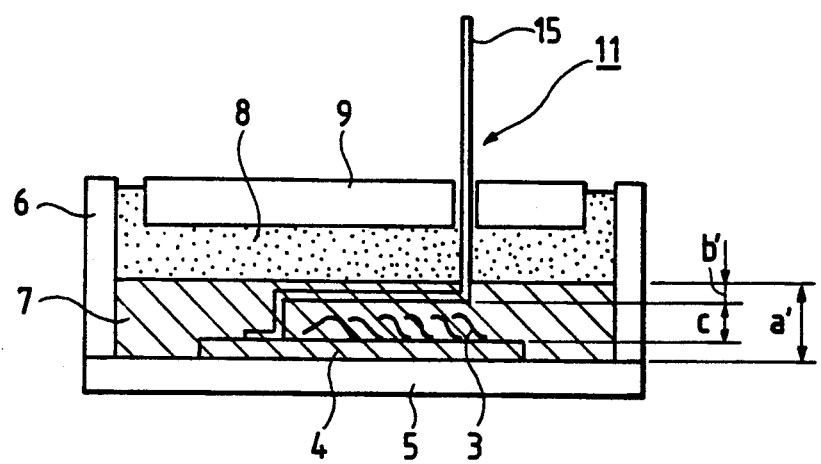
FIG. 1
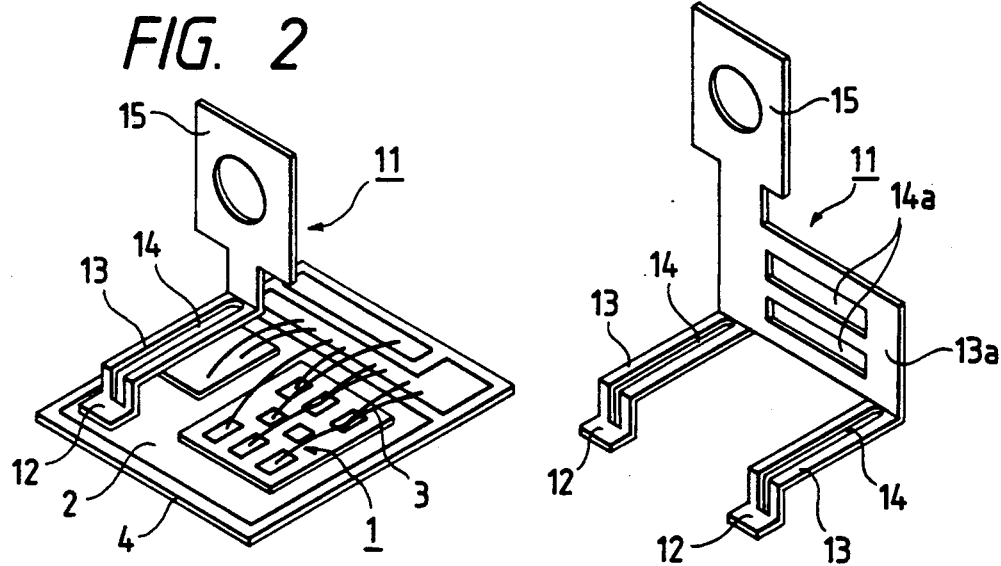
FIG. 2
FIG. 3
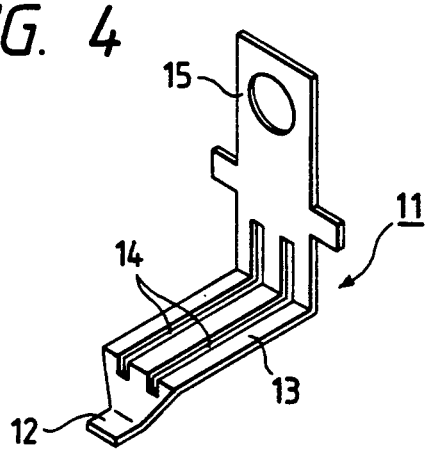
FIG. 4

SEALED SEMICONDUCTOR DEVICE WITH PROTRUDING PORTION

BACKGROUND OF THE INVENTION

1. Field of the Invention

The present invention relates to a sealed semiconductor component, and more particularly to an improved structure for the inner connection terminal board in a sealed semiconductor device.

2. Discussion of the Related Art

The constructions of conventional examples of a sealed semiconductor device are shown in FIGS. 5 through 7.

FIG. 5 is a perspective view showing, for example, the construction of a sealed semiconductor device prior to sealing the device. The sealed semiconductor device thus shown is provided with an inner connection terminal board 21. FIG. 6 is a schematic structure of the semiconductor device after it has been sealed. FIG. 7 is a perspective view of an alternate example of a conventional inner connection terminal board 21, shown apart from the sealed semiconductor device.

In the construction of the device shown in FIG. 5, a semiconductor chip 1 such as a chip of power transistor, MOSFET or IGBT, includes a plurality of integrated and self-contained semiconductor elements into one body. The semiconductor chip 1, an inner connection terminal board 21, a control terminal board (not shown) etc. are loaded onto a copper clad wiring circuit board 2. The semiconductor chip 1 and the wiring circuit board 2 are connected by inner wires 3 composed of any preselected material such as aluminum.

Inner connection terminal board 21 is formed from a conductive metal plate and is typically soldered to the copper clad wiring circuit board 2 at a predetermined location. Inner connection terminal board 21 consists of a solderable, fixed inner terminal portion 22, and an intermediate, vertically protruding portion 23 having a bent portion 24 upwardly extending from the inner terminal portion 22. Bent portion 24 forms a U-shape in parallel with the direction of width of the board. An outer terminal portion 25 first extends horizontally from the intermediate protruding portion 23 and then upwardly so as to protrude from the sealed semiconductor device.

As shown in FIG. 6, the copper clad wiring circuit board is located on an insulating substrate 4. A metal base board 5 having a function of releasing heat holds the insulating substrate 4. A side wall 6 and the base plate 5 constitute the case. Copper clad wiring circuit board 2, semiconductor chip 1, and insulating substrate 4 (except outer terminal portion 25 of the inner connection terminal board 21) are embedded in a silicon gel layer 7 in the case consisting of the base board 5 and the side wall 6. A sealing resin layer 8 is filled and solidified on top of silicon gel layer 7. A resin block 9 is arranged such that outer terminal portion 25 of the inner connection terminal board 21 protrudes from it.

The sealed semiconductor device having the inner connection terminal board 21 constructed as described above has been used in a radiation-cooled state by securing the metal base plate 5 of the case to a radiation-cooling means such as an outer cooling fin. As is conventionally known, when the semiconductor chip 1 is subjected to an energizing operation, it generates heat in proportion to its power consumption. In general, the semiconductor chip is designed to normally operate under a temperature of less than 150° C. Thus, the internal temperature of such a device may also reach approximately 150° C.

The components of the respective portions of the device thermally expand because of the heat generated by the semiconductor chip 1 during the energizing operation. The heat causes thermal expansion stress which has a tendency to peel the inner terminal portion 22 of inner connection terminal board 21 off of the connecting portion of the copper clad wiring circuit board 2. When the energizing operation ceases, the temperature of the device returns to the ambient temperature (i.e., room temperature) whereby the respective components of the device return from an expanded state to an unexpanded state. The contraction to an unexpanded state generates stress which presses the inner terminal portion 22 to the connecting portion. Consequently, the repetition of expansion and contraction exerts stress on the soldered portion that electrically connects inner terminal portion 22 to the connecting portion of copper clad wiring circuit board 2. When this stress reaches a maximum, it is possible that the soldered portion can become separated from the connecting portion due to the generation of cracks on the soldered connection face. The connection between inner terminal portion 22 and copper clad wiring circuit board 2 is then broken which results in the failure of the device.

In the construction of the conventional sealed semiconductor device, to relieve the mechanical stress generated by the cyclic thermal expansion produced by the heat generated during the energizing operation of the device, the vertical bent portion 24 of a U-shape has been used. The bent portion 24 in the intermediate protruding portion 23 relieves and absorbs the cycle stress through the cushioning action of the vertical bent portion 24 of a U-shape.

Although the bent portion 24 of the U-shape absorbs and relieves the mechanical stress due to thermal expansion and contraction during the energizing operation of the device, other problems arise because the bent portion 24 of a U-shape extends upwardly from inner terminal portion 22. The U-shape of bent portion 24 also presents problems, because it is arranged in the vertical direction from the wiring circuit board 2, yet it is bent in a U-shape in the direction of width. The thickness b, which is a height of the U-shaped bent portion 24 to be embedded in the silicon gel layer 7, must be increased as shown in FIG. 6. Further, it is necessary to increase thickness c, which is the height of the U-shaped bent portion 24 from the wiring circuit board 2, in order to avoid contact between the inner wires (metal wires) 3 and the inner connection terminal board 21. As a result, the total thickness a of silicon gel layer 7 becomes so large that a substantial quantity of silicon gel must be used to fill the space.

Additionally, in order to relieve and absorb the mechanical stress, it is important to reduce the width of the board at the U-shaped bent portion 24 so as to effectively obtain the cushioning action desired. However, a conflict arises in that the internal inductance of the terminal board itself increases as the width of the board increases and the device cannot be used as a module that may accept a large current. To correct this problem it has been conventionally proposed that the internal inductance of wiring is decreased by forming a board portion 24a at the upper portions of bent portion 24, as shown in FIG. 7. However, it is difficult to fill the case 6 with silicon gel and sealing resin when the board portion 24a is present. Moreover, the cost increases as the weight of the parts increases.

SUMMARY OF THE INVENTION

The present invention has been made in view of the above circumstances and has an object to reduce the thickness of the silicon gel layer of a semiconductor device by providing an inner connection terminal board having a suitable shape.

A further object of the present invention is to provide a sealed semiconductor device that reduces the effect of cyclic mechanical stress generated by the thermal expansion and contraction of the sealed semiconductor device.

Another object of the present invention is to provide a sealed semiconductor device that has a reduced inductance so that the inner connection terminal board does not interfere with the operation of the semiconductor chip.

It is still another object of the present invention to provide aperture portions through the inner connection terminal board both to reduce the inductance of the inner connection terminal board without reducing the cross-sectional area of the respective terminal portions and to reduce thermal expansion of the sealed semiconductor device.

It is yet another object of the present invention to reduce the amount of silicon gel required in the construction of the semiconductor device so as to reduce construction costs and improve heat dissipation of the sealed semiconductor device.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects in accordance with the purpose of the invention, as embodied and broadly claimed herein, the sealed semiconductor device of this invention comprises at least one semiconductor chip. The semiconductor chip is disposed on a wiring circuit board. At least one inner wire connects the semiconductor chip to the wiring board. The wiring circuit board is disposed on the base board. The base board is enclosed on all sides to form a case. A silicon gel layer partially fills the case. A sealing resin is disposed within the case above the silicon gel layer. A resin block is then placed in contact with the sealing resin layer. At least one inner terminal portion is electrically connected to the wiring circuit board. At least one intermediate protruding portion is electrically connected to the at least one inner terminal portion. At least one aperture is provided through the at least one intermediate protruding portion. The at least one aperture is substantially disposed along a direction of a current passing through the intermediate protruding portion. An outer terminal portion is electrically connected to the at least one intermediate protruding portion.

The present invention provides a sealed semiconductor device including a semiconductor chip positioned on a metal wiring circuit board. An inner connection terminal board is provided with an outer terminal portion which protrudes from the sealed semiconductor device. The respective portions except for the outer terminal portion are embedded within the silicon gel and sealing resin. The inner connection terminal board comprises an intermediate protruding portion having an upwardly extending portion connected to the inner terminal portion. It also has a portion bent at a prescribed angle with respect to the direction of thickness of the board, and it has a prescribed number of aperture portions as lightening portions formed parallel to or substantially parallel to a current flowing direction. The inner connection terminal board has an end portion connected to the outer terminal portion. It is designed such that the second moment of area of the intermediate protruding portion and the terminal board itself is reduced, because the intermediate protruding portion between the inner and outer terminal portions is bent with respect to the direction of thickness of the board. Moreover, the construction of the present invention makes possible various improvements over the conventional examples. Namely, the inner connection terminal board effectively relieves and absorbs mechanical stress generated by cyclic expansion and contraction of the sealed semiconductor device. The silicon gel is easily filled in the sealed semiconductor case. Further, according to the formation of the plurality of aperture portions, the effective surface area for a current flow increases so that the wiring inductance is diminished. This effect becomes pronounced as the frequency of the current increases.

BRIEF DESCRIPTION OF THE DRAWINGS

The accompanying drawings, which are incorporated in and constitute part of this specification illustrate embodiments of the invention and, together with the description, serve to explain the objects, advantages and principles of the invention.

In the drawings,

FIG. 1 is a sectional view showing, for example, a schematic construction of an embodiment of the sealed semiconductor device of the present invention to which an inner connection terminal board is attached;

FIG. 2 is a perspective view showing, for example, the semiconductor device before it is sealed;

FIGS. 3 and 4 are perspective views respectively showing inner connection terminal boards according to alternate embodiments of the present invention;

DESCRIPTION OF THE PREFERRED EMBODIMENTS

The embodiments of a sealed semiconductor device of the present invention will now be described in detail with reference to FIGS. 1 through 4.

Figure 5:
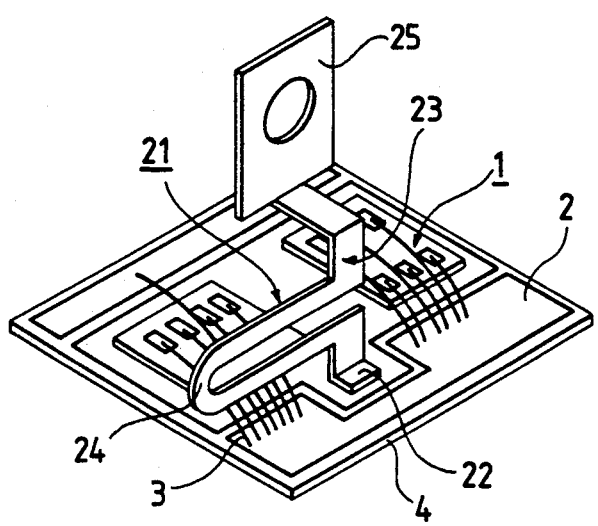
FIG. 5 is a perspective view of the seal type semiconductor device of the present invention having an inner connection terminal board from the prior art.
Figure 7:
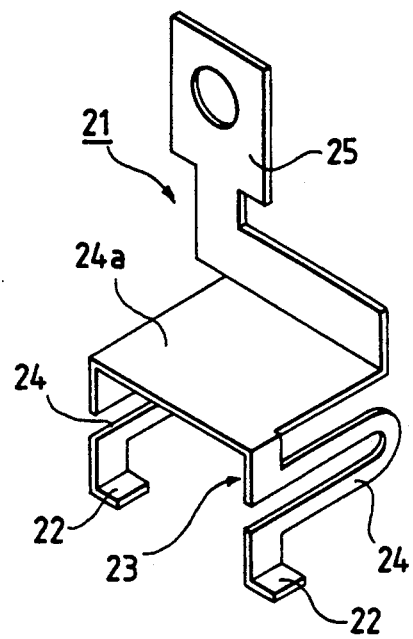
FIG. 7 is a perspective view of an alternate construction of a conventional inner connection terminal board, shown removed from the semiconductor device.
Figure 6:
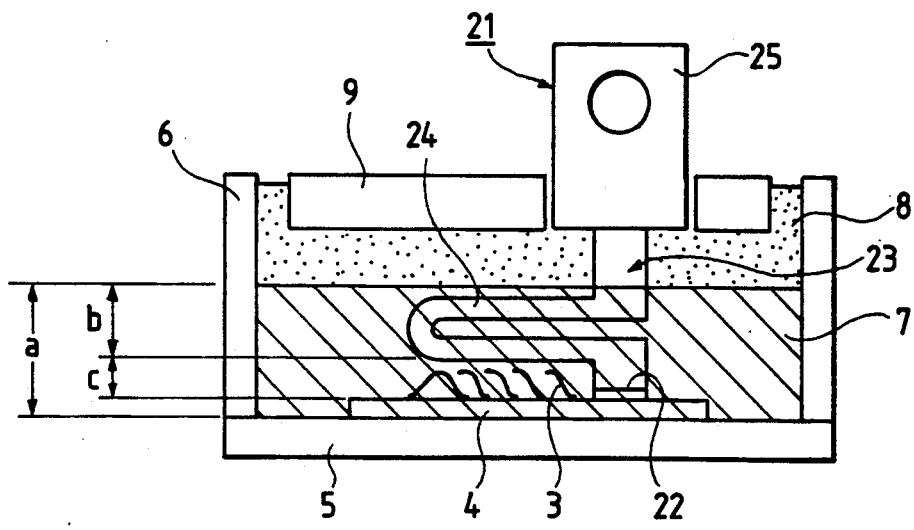
FIG. 6 is a cross-sectional illustration showing the construction of the sealed semiconductor device after it has been sealed.

FIG. 1 is a cross-sectional view showing, for example, a schematic construction of an embodiment of the sealed semiconductor device of the present invention to which an inner connection terminal board 11 is attached. FIG. 2 is a perspective view showing, for example, the construction of the device as shown in FIG. 1 before sealing. FIGS. 3 and 4 are perspective views of alternate embodiments of the present invention respectively showing only the inner connection terminal boards 11. In the constructions of the respective embodiments shown in FIGS. 1 through 4, the same numerals designate the same components of the sealed semiconductor device as depicted in FIGS. 5 through 7.

In the sealed semiconductor device of the present invention, the structure of the inner connection terminal board is improved as described below.

In a device of an embodiment shown in FIGS. 1 and 2, an inner connection terminal board 11 is obtained by integrally forming a thin metal board having a predetermined conductivity and elasticity. Inner connection terminal board 11 comprises an inner terminal portion 12 connected by soldering and fixed to a prescribed connecting portion of a copper clad metal wiring circuit board 2. An intermediate protruding portion 13 has a portion upwardly extended to such a height as not to come into contact with inner wires 3. Intermediate protruding portion 13 has a portion bent at a prescribed angle with respect to the direction of its thickness, perpendicularly, or substantially perpendicularly, in this case, which extends along copper clad wiring circuit board 2. Intermediate protruding portion 13 has an upwardly extending portion and an aperture portion 14 extending a predetermined distance parallel to, or substantially parallel to the current flowing direction. An outer terminal portion 15 connected to an opposite end portion of intermediate protruding portion 13 is provided which protrudes from the semiconductor device through a resin block 9. The inner connection terminal board 11 of the present invention is loaded on the wiring circuit board 2 as in the case of the conventional device.

In the inner connection terminal board 11 of the present invention, the above-mentioned mechanical variation due to the difference in thermal expansion is relieved and absorbed by intermediate protruding portion 13. The internal inductance of intermediate protruding portion 13 is also decreased by the aperture portion 14.

Since intermediate protruding portion 13 of inner connection terminal board 11 is bent with respect to the direction of thickness of the board, while thickness C for avoiding the contact of the inner wires 3 with the inner connection terminal board 11 remains essentially the same as in the conventional device, thickness b' (thickness of coating the intermediate protruding portion) of a silicon gel layer 7 for embedding intermediate protruding portion 13, and further, thickness a' (entire thickness of the silicon gel layer) can be significantly reduced by up to approximately 30%. This can contribute to the miniaturization of the device. The decrease in thickness b' also helps to decrease the quantity of silicon gel required to fill the space. Therefore, the volumetric expansion due to heat can be relatively minimized, and the stress imposed on the inner terminal portion 12 can thereby be reduced. Even if the soldered area of the connecting portion of copper clad metal wiring circuit board 2 is equal to that of in the conventional device, the reliability of the soldered and fixed portion can be effectively improved. Providing the aperture portion 14 formed throughout the range of a prescribed length parallel to, or substantially parallel to the current flowing direction, which increase the effective surface area for the current flow, can easily and completely decrease the internal inductance of the wiring in the inner connection terminal board 11 by up to approximately 50% of that of the conventional sealed semiconductor device. It is, therefore, anticipated that the device of the present invention may be applied to a larger current module.

Typically, in connecting terminal board 11 of the embodiment shown in FIGS. 1 and 2, inner terminal portion 12 and intermediate protruding portion 13, and the aperture portion 14 are formed in a one-line shape. However, inner terminal portions 12 and intermediate protruding portion 13 may consist of a plurality of strips, as shown in FIGS. 3 and 4. It is understood that intermediate protruding portion 13 may be interconnected by a connecting portion 13a and may be formed with a plurality of aperture portions 14a formed in the connecting portion 13a. Moreover, a plurality of aperture portions 14 may be formed in a singular, linear, intermediate protruding portion 13 to provide superior advantages with respect to the decrease of the internal inductance of the wiring as shown in FIG. 4.

The foregoing description of the preferred embodiments of the present invention has been presented for purposes of illustration and description. It is not intended to be exhaustive or to limit the invention to the precise form disclosed, and modifications and variations are possible in light of the above teachings or may be acquired from practice of the invention. The embodiments ar chosen and described in order to explain the principles of the present invention and its practical application to enable the skilled in the art to utilize the invention in various embodiments and with various modifications as are suited to the particular use contemplated. It is intended that the scope of the invention be defined by the claims appended hereto, and their equivalents.

What is claimed is:

1. A sealed semiconductor device, comprising:
   at least one semiconductor chip;
   a wiring circuit board having the at least one semiconductor chip disposed thereon;
   at least one inner wire connecting the semiconductor chip to the wiring circuit board;
   a base board having the wiring circuit board disposed thereon;
   the base board enclosed on all sides forming a case;
   a silicon gel layer partially filling the case;
   a sealing resin layer disposed within the case above the silicon gel layer;
   a resin block in contact with the sealing resin layer;
   at least one inner terminal portion electrically connected to the wiring circuit board;
   at least one intermediate protruding portion electrically connected to and protruding upwardly from the at least one inner terminal portion;
   at least one aperture through the at least one intermediate protruding portion;
   the at least one aperture substantially disposed along a direction of a current passing through the at least one intermediate protruding portion within the case; and
   an outer terminal portion electrically connected to the at least one intermediate protruding portion.

2. A sealed semiconductor device according to claim 1, further comprising:
   a connecting portion electrically connecting a plurality of intermediate protruding portions together;
   the connecting portion electrically connecting the plurality of intermediate protruding portions to the outer terminal portion; and the connecting portion having at least one aperture substantially disposed along a direction of a current passing through the connecting portion.

3. A sealed semiconductor device according to claim 1, wherein:
the at least one intermediate protruding portion extends substantially vertically from the at least one inner terminal portion to at least a height above the at least one inner wire to prevent electrical connection with the at least one inner wire.

4. A sealed semiconductor device according to claim 3, wherein:
a substantial portion of the at least one intermediate protruding portion is disposed essentially parallel to a surface of the wiring circuit board.

5. A sealed semiconductor device according to claim 1, wherein:
the resin block is disposed within the sealing resin block.

6. A sealed semiconductor device according to claim 1, wherein:
the resin block is disposed atop the sealing resin layer.

7. A sealed semiconductor device according to claim 1, wherein:
the at least one inner terminal portion is disposed within the silicon gel layer.

8. A sealed semiconductor device according to claim 1, wherein:
the at least one intermediate protruding portion is substantially disposed within the silicon gel layer.

9. A sealed semiconductor device according to claim 1 further comprising:
an insulating substrate having the wiring circuit board disposed thereon; and
the insulating substrate disposed on the base board.

10. An inner connection terminal board for use in a solid semiconductor device, the sealed semiconductor device having at least one semiconductor chip, a wiring circuit board having the at least one semiconductor chip disposed thereon, at least one inner wire connecting the semiconductor chip to the wiring circuit board, a base board having the wiring circuit board disposed thereon, the base board enclosed on all sides to form a case, a silicon gel layer partially filling the case, a sealing resin disposed within the case above the silicon gel layer, and a resin block in contact with the sealing resin layer, the inner connection terminal board comprising:
at least one terminal portion electrically connected to the wiring circuit board;
at least one intermediate protruding portion electrically connected to and upwardly protruding from the at least one inner terminal portion;
at least one aperture through the at least one intermediate protruding portion;
the at least one aperture substantially disposed along a direction of a current passing through the at least one intermediate protruding portion within the case; and
an outer terminal portion electrically connected to the at least one intermediate protruding portion.

11. An inner connection terminal board according to claim 10, further comprising:
a connecting portion electrically connecting a plurality of intermediate protruding portions together;
the connecting portion electrically connecting the plurality of intermediate protruding portions to the outer terminal portion; and
the connecting portion having at least one aperture substantially disposed along a direction of a current passing through the connecting portion.

12. An inner connection terminal board according to claim 10, wherein:
the at least one intermediate protruding portion extends substantially vertically from the at least one inner terminal portion to at least a height above the at least one inner wire to prevent electrical connection with the at least one inner wire.

13. An inner connection terminal based according to claim 12, wherein:
a substantial portion of the at least one intermediate protruding portion is disposed essentially parallel to a surface of the wiring circuit board.

14. An inner connection terminal board connecting to claim 10, wherein:
the resin block is disposed within the sealing resin layer.

15. An inner connection terminal board according to claim 10, wherein:
the resin block is disposed atop the sealing resin layer.

16. An inner connection terminal board according to claim 10, wherein:
the at least one inner terminal portion is disposed within the silicon gel layer.

17. An inner connection terminal board, according to claim 10, wherein:
the at least one intermediate protruding portion is substantially disposed within the silicon gel layer.

18. An inner connection terminal board according to claim 10, further comprising:
an insulating substrate having the wiring circuit board disposed thereon; and
the insulating substrate disposed on the base board.

19. A sealed semiconductor device, comprising:
at least one semiconductor chip;
a wiring circuit board having the at least one semiconductor chip disposed thereon;
at least one inner wire connecting the semiconductor chip to the wiring circuit board;
a base board having the wiring circuit board disposed thereon;
the base board enclosed on all sides forming a case;
a silicon gel layer partially filling the case;
a sealing resin layer disposed within the case above the silicon gel layer;
a resin block in contact with the sealing resin layer;
at least one inner terminal portion electrically connected to the wiring circuit board;
at least one intermediate protruding portion electrically connected to and upwardly protruding from the at least one inner terminal portion;
at least one aperture through the at least one intermediate protruding portion;
the at least one aperture substantially disposed along a direction of a current passing through the at least one intermediate protruding portion;
an outer terminal portion electrically connected to the at least one intermediate protruding portion;
a connecting portion electrically connecting a plurality of intermediate protruding portions together;
the connecting portion electrically connecting the plurality of intermediate protruding portions to the outer terminal portion; and
the connecting portion having at least one aperture substantially disposed along a direction of a current passing through the connecting portion.

20. An inner connection terminal board for use in a solid semiconductor device, the sealed semiconductor device having at least one semiconductor chip, a wiring circuit board having the at least one semiconductor chip disposed thereon, at least one inner wire connecting the semiconductor chip to the wiring circuit board, a base board having the wiring circuit board disposed thereon, the base board enclosed on all sides to form a case, a silicon gel layer partially filling the case, a sealing resin disposed within the case above the silicon gel layer, and a resin block in contact with the sealing resin layer, the inner connection terminal board comprising:
- at least one terminal portion electrically connected to the wiring circuit board;
- at least one intermediate protruding portion electrically connected to and upwardly protruding from the at least one inner terminal portion;
- at least one aperture through the at least one intermediate protruding portion;
- the at least one aperture substantially disposed along a direction of a current passing through the at least one intermediate protruding portion;
- an outer terminal portion electrically connected to the at least one intermediate protruding portion;
- a connecting portion electrically connecting a plurality of intermediate protruding portions together;
- the connecting portion electrically connecting the plurality of intermediate protruding portions to the outer terminal portion; and
- the connecting portion having at least one aperture substantially disposed along a direction of a current passing through the connecting portion.

21. A sealed semiconductor device, comprising:
- at least one semiconductor chip;
- a wiring circuit board having the at least one semiconductor chip disposed thereon;
- at least one inner wire connecting the semiconductor chip to the wiring circuit board;
- a base board having the wiring circuit board disposed thereon;
- the base board enclosed on all sides forming a case;
- a silicon gel layer partially filling the case;
- a sealing resin layer disposed within the case above the silicon gel layer;
- a resin block in contact with the sealing resin layer;
- at least one inner terminal portion electrically connected to the wiring circuit board;
- at least one intermediate protruding portion electrically connected to and upwardly protruding from the at least one inner terminal portion;
- at least one aperture through the at least one intermediate protruding portion;
- the at least one aperture substantially disposed along a direction of a current passing through the at least one intermediate protruding portion;
- an outer terminal portion electrically connected to the at least one intermediate protruding portion; and
- the resin block is disposed atop the sealing resin layer.

22. An inner connection terminal board for use in a solid semiconductor device, the sealed semiconductor device having at least one semiconductor chip, a wiring circuit board having the at least one semiconductor chip disposed thereon, at least one inner wire connecting the semiconductor chip to the wiring circuit board, a base board having the wiring circuit board disposed thereon, the base board enclosed on all sides to form a case, a silicon gel layer partially filling the case, a sealing resin disposed within the case above the silicon gel layer, and a resin block in contact with the sealing resin layer, the inner connection terminal board comprising:
- at least one terminal portion electrically connected to the wiring circuit board;
- at least one intermediate protruding portion electrically connected to and upwardly protruding from the at least one inner terminal portion;
- at least one aperture through the at least one intermediate protruding portion;
- the at least one aperture substantially disposed along a direction of a current passing through the at least one intermediate protruding portion;
- an outer terminal portion electrically connected to the at least one intermediate protruding portion; and
- the resin block is disposed atop the sealing resin layer.

23. A sealed semiconductor device, comprising:
- at least one semiconductor chip;
- a wiring circuit board having the at least one semiconductor chip disposed thereon;
- at least one inner wire connecting the semiconductor chip to the wiring circuit board;
- a base board having the wiring circuit board disposed thereon;
- the base board enclosed on all sides forming a case;
- a silicon gel layer partially filling the case;
- a sealing resin layer disposed within the case above the silicon gel layer;
- a resin block in contact with the sealing resin layer;
- at least one inner terminal portion electrically connected to the wiring circuit board;
- at least one intermediate protruding portion electrically connected to and upwardly protruding from the at least one inner terminal portion;
- at least one aperture through the at least one intermediate protruding portion;
- the at least one aperture substantially disposed along a direction of a current passing through the at least one intermediate protruding portion;
- an outer terminal portion electrically connected to the at least one intermediate protruding portion; and
- the at least one intermediate protruding portion being substantially disposed within the silicon gel layer.

24. An inner connection terminal board for use in a solid semiconductor device, the sealed semiconductor device having at least one semiconductor chip, a wiring circuit board having the at least one semiconductor chip disposed thereon, at least one inner wire connecting the semiconductor chip to the wiring circuit board, a base board having the wiring circuit board disposed thereon, the base board enclosed on all sides to form a case, a silicon gel layer partially filling the case, a sealing resin disposed within the case above the silicon gel layer, and a resin block in contact with the sealing resin layer, the inner connection terminal board comprising:
- at least one terminal portion electrically connected to the wiring circuit board;
- at least one intermediate protruding portion electrically connected to and upwardly protruding from the at least one inner terminal portion;
- at least one aperture through the at least one intermediate protruding portion;
- the at least one aperture substantially disposed along a direction of a current passing through the at least one intermediate protruding portion;

an outer terminal portion electrically connected to the at least one intermediate protruding portion; and the at least one intermediate protruding portion being substantially disposed within the silicon gel layer.

25. A sealed semiconductor device, comprising:
at least one semiconductor chip;
a wiring circuit board having the at least one semiconductor chip disposed thereon;
at least one inner wire connecting the semiconductor chip to the wiring circuit board;
a base board having the wiring circuit board disposed thereon;
the base board enclosed on all sides forming a case;
a silicon gel layer partially filling the case;
a sealing resin layer disposed within the case above the silicon gel layer;
a resin block in contact with the sealing resin layer;
at least one inner terminal portion electrically connected to the wiring circuit board;
at least one intermediate protruding portion electrically connected to and upwardly protruding from the at least one inner terminal portion;
at least one aperture through the at least one intermediate protruding portion;
the at least one aperture substantially disposed along a direction of a current passing through the at least one intermediate protruding portion;
an outer terminal portion electrically connected to the at least one intermediate protruding portion;
the at least one intermediate protruding portion extending substantially vertically from the at least one inner terminal portion to at least a height above the at least one inner wire to prevent electrical connection with the least one inner wire; and
a substantial portion of the at least one intermediate protruding portion being disposed essentially parallel to a surface of the wiring circuit board.

26. An inner connection terminal board for use in a solid semiconductor device, the sealed semiconductor device having at least one semiconductor chip, a wiring circuit board having the at least one semiconductor chip disposed thereon, at least one inner wire connecting the semiconductor chip to the wiring circuit board, a base board having the wiring circuit board disposed thereon, the base board enclosed on all sides to form a case, a silicon gel layer partially filling the case, a sealing resin disposed within the case above the silicon gel layer, and a resin block in contact with the sealing resin layer, the inner connection terminal board comprising:
at least one terminal portion electrically connected to the wiring circuit board;
at least one intermediate protruding portion electrically connected to and upwardly protruding from the at least one inner terminal portion;
at least one aperture through the at least one intermediate protruding portion;
the at least one aperture substantially disposed along a direction of a current passing through the at least one intermediate protruding portion;
an outer terminal portion electrically connected to the at least one intermediate protruding portion;
the at least one intermediate portion extending substantially vertically from the at least one inner terminal portion to at least a height above the at least one inner wire to prevent electrical connection with the at least one inner wire; and
a substantial portion of the at least one intermediate protruding portion being disposed essentially parallel to a surface of the wiring circuit board.

* * * * *